(12) United States Patent
Raymond

(10) Patent No.: US 9,333,735 B2
(45) Date of Patent: May 10, 2016

(54) METHODS FOR OPERATING A DEBONDER

(71) Applicant: GLOBALFOUNDRIES INC., Grand Cayman (KY)

(72) Inventor: Patrick A. Raymond, Enosburg Falls, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 105 days.

(21) Appl. No.: 14/244,112

(22) Filed: Apr. 3, 2014

(65) Prior Publication Data

US 2015/0283798 A1    Oct. 8, 2015

(51) Int. Cl.
*B32B 38/10* (2006.01)
*B32B 43/00* (2006.01)
*H01L 23/00* (2006.01)

(52) U.S. Cl.
CPC .............. *B32B 43/006* (2013.01); *H01L 24/98* (2013.01); *B32B 38/10* (2013.01); *B32B 2307/20* (2013.01); *B32B 2457/14* (2013.01); *Y10T 156/1111* (2015.01)

(58) Field of Classification Search
CPC .. B32B 38/10; B32B 43/006; Y10T 156/1111
USPC ........................................................ 156/703
See application file for complete search history.

(56) References Cited

U.S. PATENT DOCUMENTS

| | | | |
|---|---|---|---|
| 5,447,596 A * | 9/1995 | Hayase | H01L 21/6835 156/701 |
| 7,211,168 B2 | 5/2007 | Miyanari | |
| 8,181,660 B2 | 5/2012 | Nakamura et al. | |
| 8,377,256 B2 | 2/2013 | Nakada et al. | |
| 8,449,691 B2 | 5/2013 | Nakamura et al. | |
| 8,475,602 B2 | 7/2013 | Matsui et al. | |
| 2005/0145264 A1 | 7/2005 | Sakurai et al. | |
| 2005/0173064 A1 * | 8/2005 | Miyanari | H01L 21/6708 156/703 |
| 2006/0070641 A1 | 4/2006 | Kim | |
| 2007/0062644 A1 * | 3/2007 | Nakamura | B29C 63/0013 156/703 |
| 2008/0092806 A1 | 4/2008 | West et al. | |
| 2010/0024853 A1 | 2/2010 | Nakamura et al. | |
| 2011/0259527 A1 * | 10/2011 | Nakada | B32B 43/006 156/703 |
| 2012/0000613 A1 * | 1/2012 | Thallner | H01L 21/67092 156/703 |

FOREIGN PATENT DOCUMENTS

WO    2010121068 A2    10/2010

* cited by examiner

*Primary Examiner* — Mark A Osele
*Assistant Examiner* — Nickolas Harm
(74) *Attorney, Agent, or Firm* — Thompson Hine LLP; Anthony J. Canale

(57) ABSTRACT

Methods for releasing a device substrate temporarily bonded by a bonding layer to a carrier substrate. A dissolution head is engaged with the carrier substrate and a first dissolution process is performed to partially remove the bonding layer. After the first dissolution process is completed, the dissolution head is disengaged from the carrier substrate, and then re-engaged with the carrier substrate. In response to re-engaging the dissolution head with the carrier substrate, a second dissolution process is performed to further remove the bonding layer remaining after the first dissolution process.

17 Claims, 3 Drawing Sheets

METHODS FOR OPERATING A DEBONDER

BACKGROUND

The invention generally relates to semiconductor manufacturing and, more particularly, relates to methods for debonding a device substrate from a carrier substrate.

Wafer thinning has been driven by the need to make packages thinner to allow for stacking and high density packaging of chips, and in conjunction with the fabrication of through silicon vias used in stacking. Once thinned, the backside of a device substrate may be subjected to additional operations. To lend mechanical support to the device substrate during thinning and to the thinned device substrate after thinning, the surface of the device substrate bearing the integrated circuits may be adhesively bonded in a temporary manner to a carrier substrate. After the device substrate has been processed in its bonded condition, the substrates are separated by a debonding process. One approach for debonding the device substrate from the carrier substrate relies on a liquid chemical agent, such as a solvent, to dissolve the adhesive temporarily bonding the substrates together.

Improved methods are needed for debonding a device substrate from a carrier substrate.

SUMMARY

In an embodiment of the invention, a method is provided for releasing a device substrate temporarily bonded by a bonding layer to a carrier substrate. A dissolution head is engaged with the carrier substrate and a first dissolution process is performed to partially remove the bonding layer. After the first dissolution process is completed, the dissolution head is disengaged from the carrier substrate, and then re-engaged with the carrier substrate. In response to re-engaging the dissolution head with the carrier substrate, a second dissolution process is performed to further remove the bonding layer remaining after the first dissolution process.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
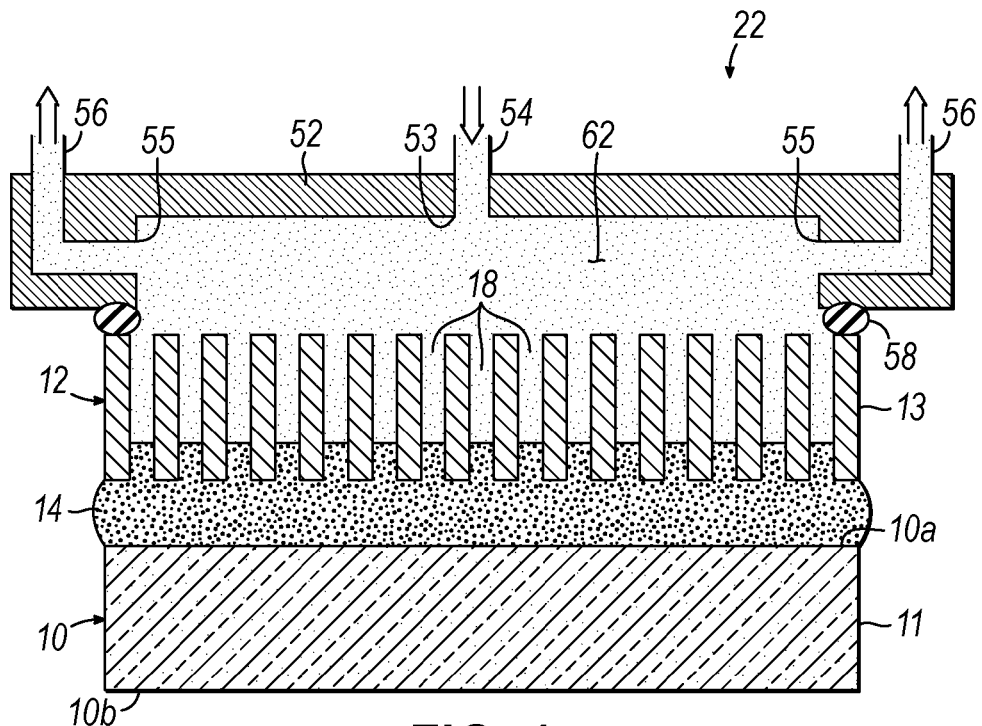
FIG. 1 is a cross-sectional view of a head being used in accordance with an embodiment of the invention to dissolve an adhesive layer bonding a device wafer to a carrier wafer.

With reference to FIG. 1 and in accordance with an embodiment of the invention, a device substrate 10 is temporarily bonded to a carrier substrate 12 by a bonding layer 14. The carrier substrate 12 may be temporarily bonded by the bonding layer 14 to the device substrate 10. The carrier substrate 12 operates as a support plate to ensure reliable handling and mechanical support when processing the device substrate 10 under circumstances in which, for example, the device substrate 10 is either thin or flexible. The substrates 10, 12 may have similar geometrical shapes (e.g., round) and may have perimeters (e.g., outer diameters) of similar dimensions.

The device substrate 10 may be comprised of a silicon wafer or another material suitable for the fabrication of an integrated circuit, display, etc. A front surface 10a of the device substrate 10 is processed by device fabrication to form, for example, one or more integrated circuits. The carrier substrate 12 may be comprised of a material such as silicon, glass, sapphire, quartz, metal, etc. The material comprising the carrier substrate 12 may have mechanical and thermal properties similar to those of the material comprising the device substrate 10. For example, the materials for the substrates 10, 12 may be chosen to have approximately equivalent coefficients of thermal expansion. The thickness of the carrier substrate 12 may be greater than the thickness of the device substrate 10 to provide mechanical support or lend additional mechanical robustness to the device substrate 10.

The bonding layer 14 may be comprised of a polymeric adhesive that is used to adhesively bond the substrates 10, 12. The polymeric adhesive may be a silicone, a polyimide, an acrylate, or another type of polymer, and may be applied by spin coating or spray coating from solution. The device substrate 10 is temporarily bonded to the carrier substrate 12 by the bonding layer 14 such that the device substrate 10 can be easily released without damaging the device substrate 10 or its devices. The bonding layer 14 may have a thickness equal to several microns. The processed front surface 10a of the device substrate 10 faces the bonding layer 14, and the unprocessed back surface 10b of the device substrate 10 is accessible for further processing, such as thinning.

The device substrate 10 may be safely handled and subjected to further processing of the back surface 10b that might otherwise have damaged the device substrate 10 in the absence of being bonded to carrier substrate 12. Thus, the assembly of the composite structure may be safely subjected to backside processing of the back surface 10b, such as backgrinding, chemical mechanical polishing, etching, metal and dielectric deposition, patterning (e.g., photolithography and etching), cleaning, etc., without causing separation of the temporarily-bonded substrates 10, 12. For example, backgrinding may be accomplished with mechanical grinding by a multiple-step process involving coarse and fine grinding. The device substrate 10 is thinned to a reduced thickness that is less than its initial thickness when the integrated circuits were fabricated on its front surface 10a. For example, the device substrate 10 may be thinned by the processing to a thickness of less than 100 microns, which renders the device wafer extremely fragile. The carrier substrate 12 provides support over the full dimensions of the device substrate 10 to prevent cracking and breakage so that the bonded assembly can be handled in processing tools and cassettes. The bonding layer 14 has a bonding strength to the substrates 10, 12 that prevents separation during backside processing.

After the backside processing of the back surface 10b of the device substrate 10 is completed, the device substrate 10 is subsequently removed, or debonded, from the carrier substrate 12 so that the device substrate 10 is separated from the carrier substrate 12. Debonding may rely on a chemical process using a liquid chemical agent that dissolves or decomposes the material of the bonding layer 14 to provide release. To promote the debonding, the carrier substrate 12 is perforated with passageways 18 that permit the liquid chemical agent to contact the material of the bonding layer 14 and to speed the debonding process using the liquid chemical agent.

Figure 2:
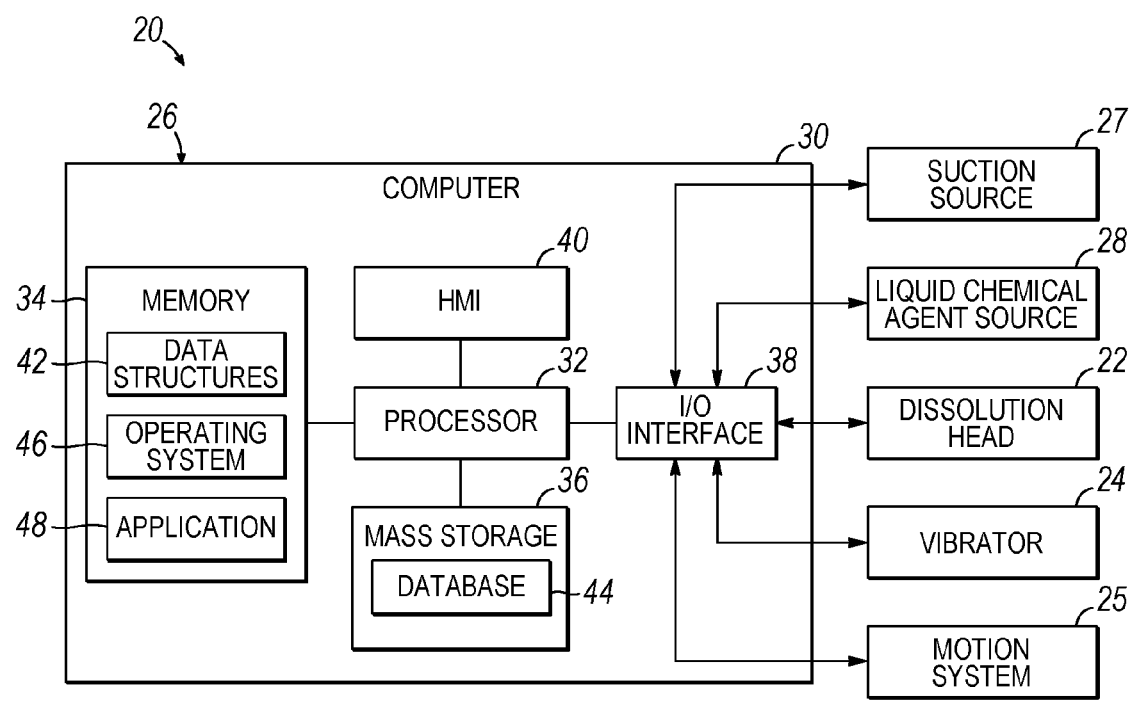
FIG. 2 is a diagrammatic view of a control system for controlling the debonder to utilize the head in the removal of the adhesive layer.
Figure 4:
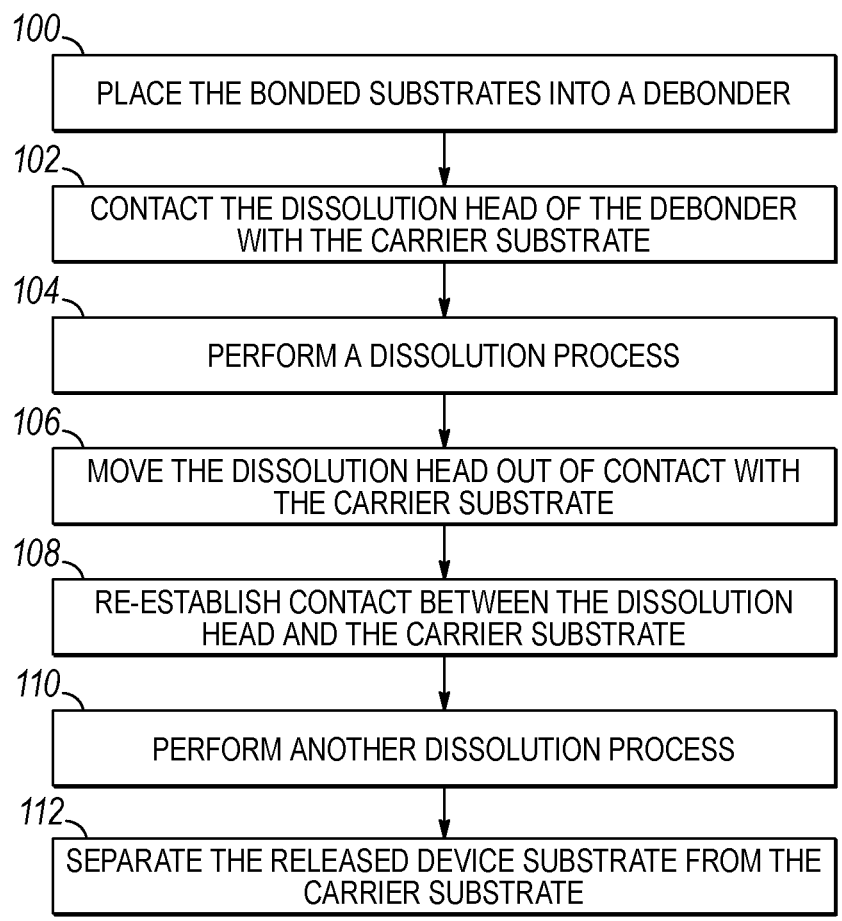
FIG. 4 is flow chart illustrating a debonding process in accordance with an embodiment of the invention.

With reference to FIGS. 1 and 2, a debonder 20 includes a dissolution head 22, a vibrator 24, a motion system 25, a suction source 27, a liquid chemical agent source 28, and a controller 26 coupled with the dissolution head 22, vibrator 24, motion system 25, suction source 27, and liquid chemical agent source 28. The debonder 20 may comprise a semi-automated system configured to debond the device substrate 10 from the carrier substrate 12. The liquid chemical agent source 28 is configured to supply amounts of fresh liquid chemical agent to the dissolution head 22. The liquid chemical agent may comprise a solvent such as limonene, dodecene, an alcohol, or propylene glycol monomethyl ether (PGME), that is selected to dissolve and/or decompose the material of the bonding layer 14. In other words, the material of the bonding layer should be susceptible to being removed by the liquid chemical agent.

The controller 26 may be implemented on one or more computing devices or systems (collectively referred to herein as a computer), such as computer 30. The computer 30 may include at least one processor 32, a memory 34, a mass storage memory device 36, an input/output (I/O) interface 38, and a Human Machine Interface (HMI) 40. The computer 30 may also be operatively coupled to one or more external resources via a network and/or the I/O interface 38. External resources may include, but are not limited to, servers, databases, mass storage devices, peripheral devices, cloud-based network services, or any other suitable computing resource that may be used by the computer 30.

The processor 32 may include one or more devices selected from microprocessors, micro-controllers, digital signal processors, microcomputers, central processing units, field programmable gate arrays, programmable logic devices, state machines, logic circuits, analog circuits, digital circuits, or any other device that manipulates signals (analog or digital) based on operational instructions that are stored in the memory 34. The memory 34 may include a single memory device or a plurality of memory devices including, but not limited to, read-only memory (ROM), random access memory (RAM), volatile memory, non-volatile memory, static random access memory (SRAM), dynamic random access memory (DRAM), flash memory, cache memory, or any other device capable of storing data. The mass storage memory device 36 may include data storage devices such as a hard drive, optical drive, tape drive, non-volatile solid state device, or any other device capable of storing data.

The processor 32 may operate under the control of an operating system 46 that resides in the memory 34. The operating system 46 may manage computing resources so that computer program code embodied as one or more computer software applications, such as an application 48 resident in the memory 34, may have its instructions executed by the processor 32. Alternatively, the processor 32 may execute the application 48 directly, in which circumstance the operating system 46 may be omitted. One or more data structures 42 may also reside in the memory 34, and may be used by the processor 32, operating system 46, or application 48 to store or manipulate data.

The I/O interface 38 may provide a machine interface that operatively couples the processor 32 to the hardware used by the debonder 20 to perform a debonding procedure to separate the substrates 10, 12. The application 48 may thereby work cooperatively with the debonder hardware by communications over the I/O interface 38 to provide the various features, functions, or processes comprising embodiments of the invention. The application 48 may also have program code that is executed by one or more external resources, or otherwise rely on functions or signals provided by other system or network components external to the computer 30. Indeed, given the nearly endless hardware and software configurations possible, a person of ordinary skill in the art will understand that applications and databases may be located externally to the computer 30, distributed among multiple computers or other external resources, or provided by computing resources (hardware and software) that are provided as a service over a network, such as a cloud computing service.

The HMI 40 may be operatively coupled to the processor 32 of computer 30 in a known manner to allow a user to interact directly with the computer 30. The HMI 40 may include video or alphanumeric displays, a touch screen, a speaker, and any other suitable audio and visual indicators capable of providing data to the user. The HMI 40 may also include input devices and controls such as an alphanumeric keyboard, a pointing device, keypads, pushbuttons, control knobs, microphones, etc., capable of accepting commands or input from the user and transmitting the entered input to the processor 32.

A database 44 may reside on the mass storage memory device 36, and may be used to collect and organize data used by the debonder 20, such as data providing recipes for procedures to debond the device substrate 10 from the carrier substrate 12. The database 44 may include data and supporting data structures that store and organize the data. In particular, the database 44 may be arranged with any database organization or structure including, but not limited to, a relational database, a hierarchical database, a network database, or combinations thereof. A database management system in the form of a computer software application executing as instructions on the processor 32 may be used to access the information or data stored in records of the database 44 in response to the initiation of a procedure to debond the device substrate 10 from the carrier substrate 12.

The dissolution head 22 includes a body 52, an inlet 54 and outlets 56 extending through the body 52, and a sealing member 58 that may have the form of an elastomeric o-ring seated in an o-ring groove in the body 52. The inlet 54 is coupled with the liquid chemical agent source 28 and may be centrally located in the body 52 of the dissolution head 22. The liquid chemical agent source 28 may heat the liquid chemical agent that is supplied to the inlet 54 to a temperature greater than room temperature. Each outlet 56 is coupled with the suction source 27 and may be located near an outer edge of the body 52 of the dissolution head 22. The outlets 56 are arranged in distributed locations about the outer circumference of the dissolution head 22 and, in use, are disposed about the outer circumference of the carrier substrate 12.

The sealing member 58, which may extend about the outer perimeter of the body 52 of the dissolution head 22, is configured to be compressed to provide a sealed peripheral interface with the carrier substrate 12 when a contacting relationship exists between the dissolution head 22 and the carrier substrate 12. In an alternative embodiment, the dissolution head 22 may be stationary and the assembly of substrates 10, 12 may be moved relative to the dissolution head 22 to provide the physical contact that compresses the sealing member 58. When the contacting relationship is present, a chamber 62 is defined between the body 52 of the dissolution head 22 and the carrier substrate 12 and interior of the sealed peripheral interface.

The chamber 62 is coupled with a port 53 of the inlet 54 and with a port 55 of each outlet 56. During a debonding procedure to dissolve or decompose the material of the bonding layer 14, the liquid chemical agent flows through the chamber 62 from port 53 to ports 55. Specifically, when flow is established, the chamber 62 receives fresh liquid chemical agent from the chemical agent source 28 through port 53 of the inlet 54 and the used liquid chemical agent is suctioned from the chamber 62 through the port 55 of each outlet 56. While in the chamber 62, the flowing liquid chemical agent is directed through the passageways 18 in the carrier substrate 12 to the location of the bonding layer 14.

The vibrator 24 is configured to be activated by the controller 26 of the debonder 20 to transfer ultrasonic energy to the liquid chemical agent in the chamber 62. The ultrasonic energy may assist with the action of the liquid chemical agent with the dissolution or decomposition of the material of the bonding layer 14. The vibrator 24 may be physically associated with the dissolution head 22.

The motion system 25 is configured to be activated by the controller 26 to move the dissolution head 22 relative to the carrier substrate 12. The motion system 25 includes a drive mechanism that is capable of imparting bi-directional movement to the dissolution head 22. The motion system 25 may move the dissolution head 22 in one direction relative to the carrier substrate 12 to engage or re-engage the dissolution head 22 with the carrier substrate 12 to establish physical contact. The sealing member 58 may be compressed between the dissolution head 22 and the carrier substrate 12 to seal the chamber 62 when the contacting relationship is present. The motion system 25 may move the dissolution head 22 in an opposite direction relative to the carrier substrate 12 to disengage the dissolution head 22 from the carrier substrate and thereby end the contacting relationship by creating a condition in which the sealing member 58 is separated from the carrier substrate 12.

In use to perform a debonding operation and with reference to FIGS. 1-4, the debonding procedure includes multiple dissolution processes that remove the bonding layer in stages or cycles. In one embodiment, that multiple dissolution processes remove the bonding layer by the same mechanism. To that end, the debonder 20 receives the device substrate 10 bonded by the bonding layer 14 to the carrier substrate 12 as an assembly (block 100 of FIG. 4). The bonded assembly may be held in a fixture with the carrier substrate 12 facing toward the dissolution head 22.

As shown in FIG. 1 and in an initial stage or cycle of the debonding procedure, the debonder 20 causes the motion system 25 to move the dissolution head 22 toward the carrier substrate 12 and to place the sealing member 58 in contact with the carrier substrate 12 (block 102). Compression of the sealing member 58 between the dissolution head 22 and the carrier substrate 12 forms a peripheral seal extending about the outer circumference of the chamber 62 and carrier substrate 12.

A dissolution process is then performed by causing the debonder 20 to supply the liquid chemical agent to the chamber 62 (block 104). Specifically, the liquid chemical agent is pumped through the inlet 54 to the chamber 62, the chamber 62 fills with a volume of the liquid chemical agent, and the liquid chemical agent is suctioned out of the chamber 62 through the outlets 56. A positive flow of the liquid chemical is thus established through the chamber 62 from the inlet 54 to the outlets 56. In the representative embodiment, the liquid chemical agent flows outwardly from the centered inlet 54 toward the peripheral outlets 56 and is vacuumed from the chamber 62 of the dissolution head 22 through the port 55 of each outlet 56. While the liquid chemical agent is present in the chamber 62, the vibrator 24 is activated to transfer ultrasonic energy to the liquid chemical agent in the chamber 62 and to the bonding layer 14.

The flow of liquid chemical agent through the chamber 62 is maintained for a time period during which the liquid chemical agent flows from the chamber 62 through the passageways 18 in the carrier substrate 12 to the location of the bonding layer 14 and wets the bonding layer 14. Over the time period, the removal of the bonding layer 14 is initiated at the location of the passageways 18 and the liquid chemical agent progressively dissolves the material of the bonding layer 14. The dissolved material is carried by the liquid chemical agent out of the chamber 62 though the outlets 56. As a numerical example, the initial time period over which the liquid chemical agent is supplied to the chamber 62 and over which dissolution of the material of the bonding layer 14 occurs may have a duration of, for example, thirty (30) seconds.

Figure 3:
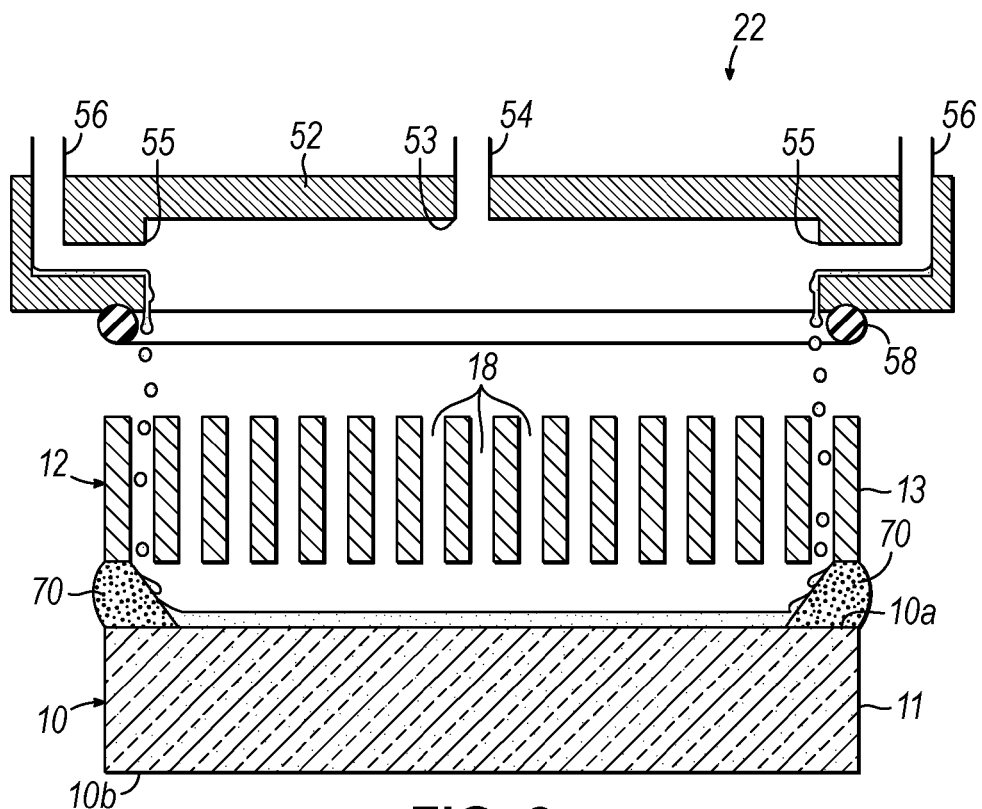
FIG. 3 is a cross-sectional view similar to FIG. 1 in which the adhesive layer is partially removed and the head is separated from the carrier wafer.

During the initial dissolution process, the material of the bonding layer 14 near the respective outer edges 11, 13 of the substrates 10, 12 may exhibit a comparatively lower degree of removal by dissolution. In particular, portions of the material of the bonding layer 14 that is localized near the ports 55 of the outlets 56 may exhibit a slower removal rate. Residual material 70, which represents these portions of the bonding layer 14, may be only partially removed by the action of the liquid chemical agent during the initial dissolution process. At other locations, the material of the bonding layer 14 may be completely removed, as shown in FIG. 3, or may only be thinned by the initial exposure to the liquid chemical agent. In any event, the bonding layer 14 is not completely removed by the initial dissolution process.

After the supply of liquid chemical agent to the chamber 62 is discontinued, residual liquid chemical agent is vacuumed from the chamber 62 through each port 55 of the outlets 56. The suction source 27 is switched off to discontinue the suction. Residual amounts of the liquid chemical agent may remain in the outlets 56 and on the exposed surfaces of the substrates 10, 12 and residual material 70.

As shown in FIG. 3, the dissolution head 22 is moved out of contact with the carrier substrate 12 (block 106). To that end, the motion system 25 may lift the dissolution head 22 to provide a non-contacting relationship. The vacuum and surface tension between the carrier substrate 12 and dissolution head 22 may allow the carrier substrate 12 to relax and pull slightly away from the device substrate 10. During this relaxation, the liquid chemical agent in and under the carrier substrate 12 may wick to areas at or near the outer edge 11 at the periphery of the device substrate 10 and may wet the areas of the residual material 70 of the bonding layer 14. In addition, the liquid chemical agent remaining in the ports 55 of the outlets 56 may backflow back onto the carrier substrate 12 to wet the areas of the residual material 70 of the bonding layer 14. Subsequent dissolution processes directed at this residual material 70 may be considerably more effective because areas of residual material 70 near the outer edge of the substrates 10, 12 and, in particular, areas of residual material 70 near the ports 53, 55 proximate to the outer edge of the substrates 10, 12 are wetted by the liquid chemical agent.

Another stage or cycle of the debonding procedure is then performed. After a brief dwell time, the dissolution head 22 is moved back into the contacting relationship with the carrier substrate 12 (block 108). Another dissolution process is then performed by causing the debonder 20 to supply the liquid chemical agent to the chamber 62 (block 110), as described above, to establish a positive flow. The vibrator 24 is activated to transfer ultrasonic energy to the liquid chemical agent in the chamber 62 and to the bonding layer 14.

During this subsequent dissolution process, the flow of liquid chemical agent through the chamber 62 is maintained for a time period during which the liquid chemical agent flows from the chamber 62 through the passageways 18 in the carrier substrate 12 to the location of the bonding layer 14 and wets the bonding layer 14. The liquid chemical agent progressively dissolves the residual material 70 and any other remaining material of the bonding layer. The dissolved material is conveyed by the liquid chemical agent out of the chamber 62 though the outlets 56.

In one embodiment, the duration of the subsequent dissolution process differs from the duration of the initial dissolution process. In another embodiment, the duration of the subsequent dissolution process may be greater than the duration of the initial dissolution process. In another embodiment, the subsequent dissolution process may be at least 50% longer than the initial dissolution process. As a numerical example, the time period over which the liquid chemical agent is supplied to the chamber 62 may have a duration of, for example, ninety (90) seconds. The duration of the dissolution process may be optimized such that the flow of the liquid chemical agent is discontinued shortly after the bonding layer 14 completely removed.

The supply of liquid chemical agent to the chamber 62 is discontinued, and residual liquid chemical agent is vacuumed from the chamber 62 through each port 55 of the outlets 56. The suction source 27 is switched off to discontinue the suction and the dissolution head 22 is moved out of contact with the carrier substrate 12. With the bonding layer 14 removed, the device substrate 10 is released by separation from the carrier substrate 12 (block 112). A low mechanical force may be needed to completely separate the substrates 10, 12.

In an alternative embodiment, the debonding procedure may include additional cycles or stages each including a dissolution process as described above. Each additional dissolution process may have the same duration as one of the preceding dissolution processes, or may have a different duration. The number and duration of the individual dissolution processes may be empirically established.

The total dissolution time for the debonding procedure is given by the sum of the durations of the individual dissolution processes. The time required to stop and start the flow of liquid chemical agent and to move the dissolution head 22 relative to the carrier substrate 12 may also contribute to the total dissolution time. The utilization of multiple dissolution process that are spaced apart in time, as described herein, may dramatically decrease the total dissolution time in comparison with debonding procedures that rely on a single, lengthier dissolution process.

In addition, the debonding procedure described herein may eliminate residual material 70 of the bonding layer 14 at the outer edge of the device wafer and near the locations of the ports 55. By comparison, debonding procedures that rely on a single, lengthier dissolution process may not completely remove the material of the bonding layer 14 at these locations.

The debonding procedure described herein may work for any thickness of the bonding layer 14, may not require a redesign of or modification to the dissolution head 22, may not require solvent resistant tape, and may increases the throughput of the debonder 20 without equipment modification.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to or with another element, there are no intervening elements present. When an element is described as being "indirectly connected" or "indirectly coupled" to or with another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for releasing a device substrate temporarily bonded by a bonding layer to a carrier substrate, the method comprising:
    engaging a dissolution head with the carrier substrate;
    in response to engaging the dissolution head with the carrier substrate, performing a first dissolution process to partially remove the bonding layer;
    in response to completion of the first dissolution process, disengaging the dissolution head from the carrier substrate;
    re-engaging the dissolution head with the carrier substrate; and
    in response to re-engaging the dissolution head with the carrier substrate, performing a second dissolution process to further remove the bonding layer remaining after the first dissolution process,
    wherein the first dissolution process occurs over a first time period, the second dissolution process occurs over a second time period that differs from the first time period, and the second time period is at least 50% longer than the first time period.

2. The method of claim 1 wherein the first dissolution process removes the bonding layer by the same mechanism as the second dissolution process.

3. The method of claim 1 wherein the first time period is 30 seconds, and the second time period is 90 seconds.

4. The method of claim 1 wherein the bonding layer is located between the carrier substrate and the device substrate, and the carrier substrate includes passageways defining flow paths for a liquid chemical agent to the bonding layer.

5. The method of claim 1 wherein the bonding layer is removed with a liquid chemical agent, and performing the first dissolution process to partially remove the bonding layer comprises:
    delivering the liquid chemical agent to the bonding layer with the dissolution head to expose the bonding layer to the liquid chemical agent and thereby provide the first dissolution process.

6. The method of claim 5 wherein performing the second dissolution process to further remove the bonding layer comprises:
    delivering the liquid chemical agent to the bonding layer with the dissolution head to further expose the bonding layer to the liquid chemical agent and thereby provide the second dissolution process.

7. The method of claim 6 wherein the liquid chemical agent is delivered to the bonding layer over the first time period during the first dissolution process, and the liquid chemical agent is delivered to the bonding layer over the second time period during the second dissolution process.

8. The method of claim 6 wherein performing the second dissolution process to further remove the bonding layer further comprises:

transferring ultrasonic energy to the liquid chemical agent during the first dissolution process.

9. The method of claim 5 wherein the liquid chemical agent is delivered to the bonding layer over the first time period during the first dissolution process, and further comprising:

applying suction to vacuum the liquid chemical agent from the dissolution head over the first time period;

in response to the first time period concluding, discontinuing the delivery of the liquid chemical agent; and while the delivery is discontinued, continuing the application of suction to vacuum residual amounts of the liquid chemical agent from the dissolution head.

10. The method of claim 9 wherein the suction is applied through a plurality of ports in the dissolution head, and further comprising:

discontinuing the application of suction so that the liquid chemical agent remaining in the ports backflows onto location portions of the bonding layer.

11. The method of claim 5 wherein performing the first dissolution process to partially remove the bonding layer further comprises:

transferring ultrasonic energy to the liquid chemical agent during the first dissolution process.

12. The method of claim 1 wherein engaging the dissolution head with the carrier substrate comprises:

moving the dissolution head into a first contacting relationship with the carrier substrate to form a chamber between the dissolution head and the carrier substrate.

13. The method of claim 12 wherein the first contacting relationship is provided by compressing a sealing member carried by the dissolution head, and disengaging the dissolution head from the carrier substrate comprises:

moving the dissolution head such that the sealing member is separated from the carrier substrate.

14. The method of claim 1 wherein the first and second dissolution processes are effective to completely remove the bonding layer.

15. The method of claim 1 further comprising:

in response to completion of the second dissolution process, disengaging the dissolution head from the carrier substrate;

re-engaging the dissolution head with the carrier substrate; and in response to re-engaging the dissolution head with the carrier substrate, performing a third dissolution process to further remove the bonding layer remaining after the second dissolution process.

16. The method of claim 1 wherein the first and second dissolution processes each expose the bonding layer to a liquid chemical agent capable of dissolving a material of the bonding layer.

17. The method of claim 16 wherein the bonding layer is comprised of an adhesive, and the liquid chemical agent is a solvent capable of dissolving the adhesive.

\* \* \* \* \*